United States Patent
Adderly et al.

(10) Patent No.: US 10,224,225 B2
(45) Date of Patent: *Mar. 5, 2019

(54) CENTERING SUBSTRATES ON A CHUCK

(71) Applicant: INTERNATIONAL BUSINESS MACHINES CORPORATION, Armonk, NY (US)

(72) Inventors: Shawn A. Adderly, Essex Junction, VT (US); Samantha D. DiStefano, Burlington, VT (US); Jeffrey P. Gambino, Westford, VT (US); Max G. Levy, Essex Junction, VT (US); Max L. Lifson, S. Burlington, VT (US); Matthew D. Moon, Jeffersonville, VT (US); Timothy D. Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/957,111

(22) Filed: Apr. 19, 2018

(65) Prior Publication Data
US 2018/0240694 A1 Aug. 23, 2018

Related U.S. Application Data

(63) Continuation of application No. 15/490,175, filed on Apr. 18, 2017, now Pat. No. 9,997,385, which is a
(Continued)

(51) Int. Cl.
*H01L 21/67* (2006.01)
*H01L 21/68* (2006.01)
(Continued)

(52) U.S. Cl.
CPC ........ *H01L 21/67259* (2013.01); *G01B 17/00* (2013.01); *G01S 15/42* (2013.01);
(Continued)

(58) Field of Classification Search
CPC ......... H01L 21/67023; H01L 21/67253; H01L 21/76814; H01L 21/76873;
(Continued)

(56) References Cited

U.S. PATENT DOCUMENTS

| 5,366,757 A * | 11/1994 | Lin | ......................... G03F 7/162 |
| | | | 118/52 |
| 5,501,104 A * | 3/1996 | Ikeda | ..................... G01B 17/00 |
| | | | 438/114 |

(Continued)

FOREIGN PATENT DOCUMENTS

| JP | 62-052928 A | 3/1987 |
| JP | 02-050455 A | 2/1990 |

(Continued)

OTHER PUBLICATIONS

Office Action (dated Feb. 29, 2016) for U.S. Appl. No. 14/183,631, filed Feb. 19, 2014.
(Continued)

*Primary Examiner* — Patrick Assouad
*Assistant Examiner* — Haidong Zhang
(74) *Attorney, Agent, or Firm* — Schmeiser, Olsen & Watts, LLP; Steven Meyers

(57) ABSTRACT

An apparatus and an associated method. The apparatus includes a chuck, an array of three or more ultrasonic sensors, a ceramic ring surrounding the chuck, and a controller connected to the ultrasonic sensors. The chuck is configured to removeably hold a substrate for processing. Each ultrasonic sensor may send a respective ultrasonic sound wave to a respective preselected peripheral region of
(Continued)

the substrate and receive a respective return ultrasonic sound wave from the preselected peripheral region. The controller may compare a measured position of the substrate on the chuck to a specified placement of the substrate on the chuck based on a measured elapsed time between sending the ultrasonic sound wave and receiving the return ultrasonic sound wave for each ultrasonic sensor. The method compares a measured position of the substrate on the chuck to a specified position on the chuck.

20 Claims, 11 Drawing Sheets

Related U.S. Application Data continuation of application No. 14/183,631, filed on Feb. 19, 2014, now Pat. No. 9,685,362.

(51) Int. Cl.
*H01L 21/683* (2006.01)
*G01B 17/00* (2006.01)
*G01S 15/42* (2006.01)

(52) U.S. Cl.
CPC ......... *H01L 21/68* (2013.01); *Y10T 29/49764* (2015.01); *Y10T 279/21* (2015.01)

(58) Field of Classification Search
CPC ... H01L 21/76879; H01L 22/12; H01L 22/26; H01L 21/67259; H01L 21/68; G01B 17/00; G01S 15/42; Y10T 279/21; Y10T 29/49764

See application file for complete search history.

(56) References Cited

U.S. PATENT DOCUMENTS

| | | | |
|---|---|---|---|
| 6,567,725 B1* | 5/2003 | Wilkey | G05B 19/401 318/568.1 |
| 6,704,089 B2 | 3/2004 | van der Schaar et al. | |
| 7,661,315 B2 | 2/2010 | Busch et al. | |
| 8,508,239 B2 | 8/2013 | Valcore | |
| 9,685,362 B2 | 6/2017 | Adderly et al. | |
| 2008/0056857 A1* | 3/2008 | Hiroki | H01L 21/681 414/217.1 |
| 2009/0165956 A1* | 7/2009 | Nam | H01L 21/6831 156/345.51 |
| 2014/0043944 A1* | 2/2014 | Wilt | G10K 9/122 367/180 |
| 2015/0235881 A1 | 8/2015 | Adderly et al. | |
| 2017/0221742 A1 | 8/2017 | Adderly et al. | |

FOREIGN PATENT DOCUMENTS

| | | |
|---|---|---|
| JP | 03-012947 A | 1/1991 |
| KR | 2019990018654 U | 6/1999 |
| KR | 1020090058317 A | 6/2009 |

OTHER PUBLICATIONS

Amendment (dated May 31, 2016) for U.S. Appl. No. 14/183,631, filed Feb. 19, 2014.
Final Office Action (dated Sep. 2, 2016) for U.S. Appl. No. 14/183,631, filed Feb. 19, 2014.
Final Amendment (dated Nov. 2, 2016) for U.S. Appl. No. 14/183,631, filed Feb. 19, 2014.
Advisory Action (dated Jan. 10, 2017) for U.S. Appl. No. 14/183,631, filed Feb. 19, 2014.
RCE (dated Jan. 10, 2017) for U.S. Appl. No. 14/183,631, filed Feb. 19, 2014.
Notice of Allowance (dated Feb. 16, 2017) for U.S. Appl. No. 14/183,631, filed Feb. 19, 2014.
Office Action (dated May 26, 2017) for U.S. Appl. No. 15/490,175, filed Apr. 18, 2017.
Amendment (dated Aug. 24, 2017) for U.S. Appl. No. 15/490,175, filed Apr. 18, 2017.
Office Action (dated Sep. 28, 2017) for U.S. Appl. No. 15/490,175, filed Apr. 18, 2017.
Amendment (dated Dec. 26, 2017) for U.S. Appl. No. 15/490,175, filed Apr. 18, 2017.
Notice of Allowance (dated Feb. 5, 2018) for U.S. Appl. No. 15/490,175, filed Apr. 18, 2017.
312 amendment (dated Apr. 17, 2018) for U.S. Appl. No. 15/490,175, filed Apr. 18, 2017.

* cited by examiner

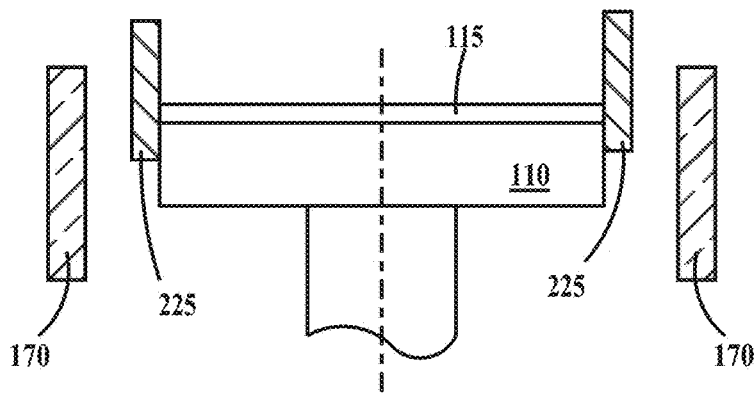
*FIG. 10*
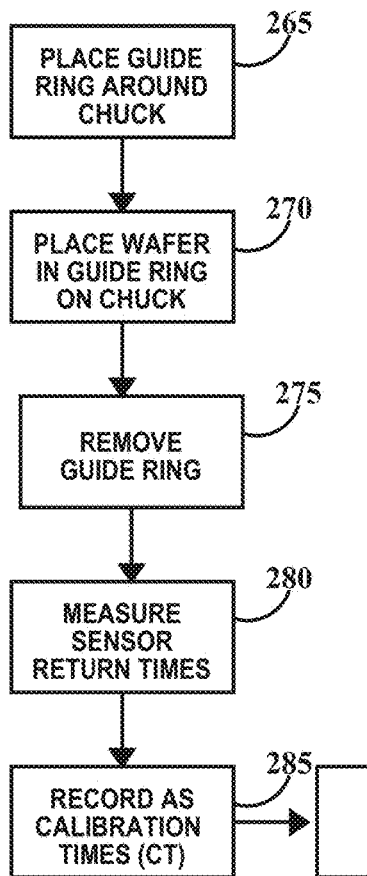
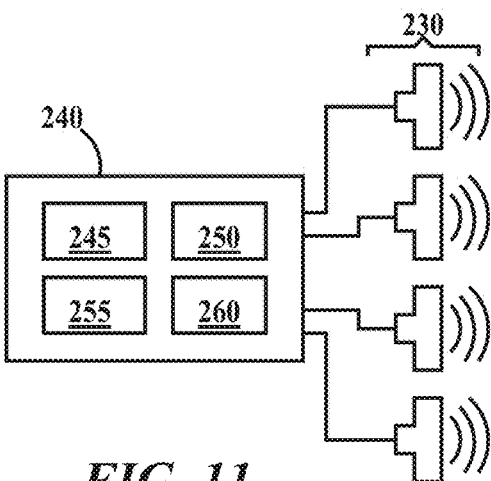
*FIG. 11*
*FIG. 12A*

CENTERING SUBSTRATES ON A CHUCK

This application is a continuation application claiming priority to Ser. No. 15/490,175, filed Apr. 18, 2017, now U.S. Pat. No. 9,997,385, issued Jun. 12, 2018, which is a continuation application of Ser. No. 14/183,631 filed Feb. 19, 2014, U.S. Pat. No. 9,685,362, issued Jun. 20, 2017.

BACKGROUND

The present invention relates to the field of semiconductor processing systems; more specifically, it relates to a method and apparatus for determining the location of semiconductor substrates on chucks used in semiconductor processing.

If a substrate is not properly positioned on a chuck during processing, material can be deposited on the chuck that lead to processing defects on substrates subsequently placed on the chuck. If the mispositioned material is not immediately detected, many defective substrates can be produced before the problem can be corrected. Accordingly, there exists a need in the art to mitigate the deficiencies and limitations described hereinabove.

BRIEF SUMMARY

A first aspect of the present invention is an apparatus, comprising: a chuck in a process chamber, the chuck configured to removeably hold a substrate for processing; an array of two or more ultrasonic sensors arranged in the process chamber, each ultrasonic sensor of the two or more ultrasonic sensors arranged relative to the chuck so as to send a respective ultrasonic sound wave to a respective preselected region of the substrate and receive a respective return ultrasonic sound wave from the preselected region of the substrate; and a controller connected to the array of two or more ultrasonic sensors and configured to compare a measured position of the substrate on the chuck to a specified placement of the substrate on the chuck based on a measured elapsed time between sending the ultrasonic sound wave and receiving the return ultrasonic sound wave for each ultrasonic sensor of the array of two or more ultrasonic sensors.

A second aspect of the present invention is a method, comprising: providing an apparatus comprising: a chuck in a process chamber, the chuck configured to removeably hold a substrate for processing; an array of two or more ultrasonic sensors arranged in the process chamber, each ultrasonic sensor of the two or more ultrasonic sensors arranged relative to the chuck so as to send a respective ultrasonic sound wave to a respective preselected region of the substrate and receive a respective return ultrasonic sound wave from the preselected region of the substrate; and a controller connected to the array of two or more ultrasonic sensors and configured to compare a measured position of the substrate on the chuck to a specified placement of the substrate on the chuck based on a measured elapsed time between sending the ultrasonic sound wave and receiving the return ultrasonic sound wave for each ultrasonic sensor of the array of two or more ultrasonic sensors; placing the substrate on the substrate chuck; and measuring a position of the substrate on the chuck using the array of two or more ultrasonic sensors and comparing the measured position to a specified position on the chuck.

These and other aspects of the invention are described below.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings, wherein:

FIG. 10 is a side view of a wafer position calibration fixture;

FIG. 11 is a schematic diagram of the tool controller link to the ultrasonic sensors of embodiments of the present invention;

FIG. 12A is a flow diagram of an exemplary method of calibrating the apparatus of embodiments of the present invention.

DETAILED DESCRIPTION

Circular (disk-like) semiconductor substrates are commonly referred to as semiconductor wafers and the chucks that hold these semiconductor wafers are commonly referred to as wafer chucks. While embodiments of the invention are described using semiconductor wafers (hereinafter wafers), embodiments of the present invention may be applied to other types of substrates that are held in chucks such as metallic and ceramic substrates and to substrates that are square or rectangular or otherwise non-circular.

Embodiments of the present invention detect misalignment of wafers on a wafer chuck and/or the presence of foreign material (FM) on a wafer chuck by means of an array of three or more ultrasonic detectors that detect the edges of the wafer chuck relative to a calibration position and/or array of three or more ultrasonic detectors that detect the top surface of the wafer relative to a calibration position. Any difference between the measured position and the calibration positions indicate wafer mispositioning and/or FM on the wafer chuck. The positions are measured by the time difference between sending an ultrasonic sound wave to the wafer and receiving a reflected sound wave back.

Figure 1:
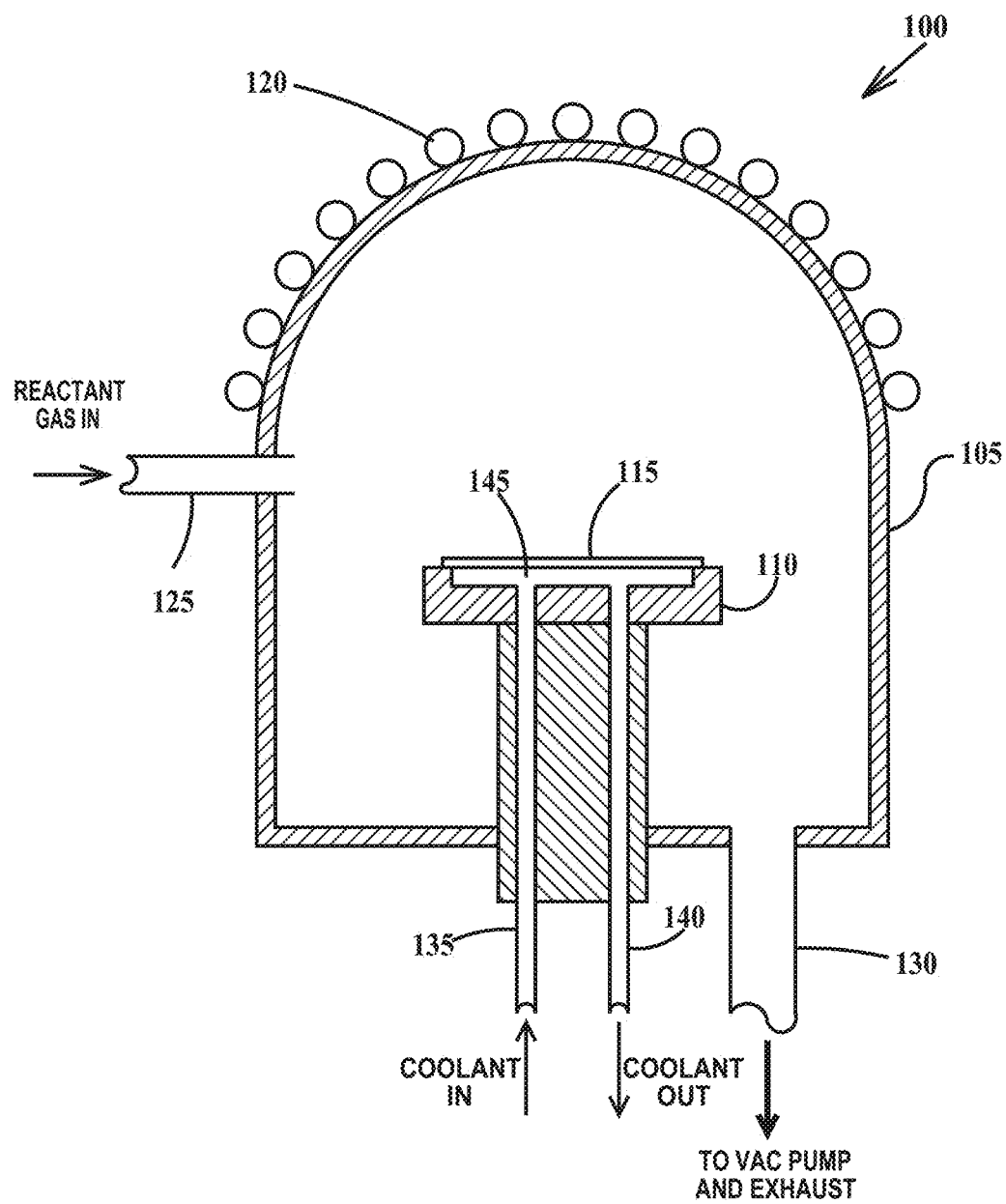
FIG. 1 is a schematic cross-section of an exemplary semiconductor process apparatus to which the present invention may be applied.

FIG. 1 is a schematic cross-section of an exemplary semiconductor process apparatus to which the present invention may be applied. In FIG. 1, a semiconductor process apparatus 100 includes a vacuum chamber 105, a wafer chuck 110 for holding a substrate 115, a set of radio frequency (RF) coils 120, means 125 for introducing reactant gas into the chamber and a vacuum pump port 130. Wafer chuck 110 includes a coolant fluid in line 135 and a coolant fluid out line 140 and a chamber 145 allowing coolant fluid to contact the backside of wafer 115.

Figure 2A:
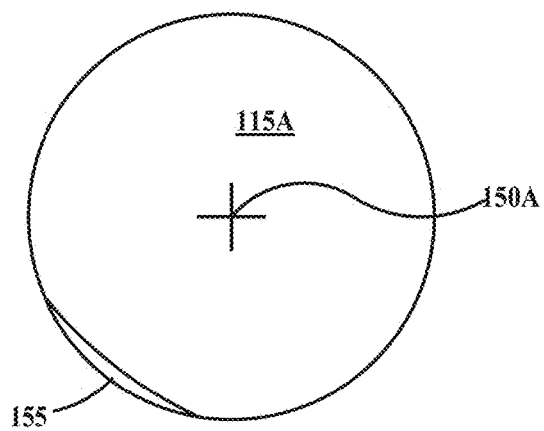
FIGS. 2A, 2B and 2C illustrate a mechanism observed to cause defects on wafers.
Figure 2B:
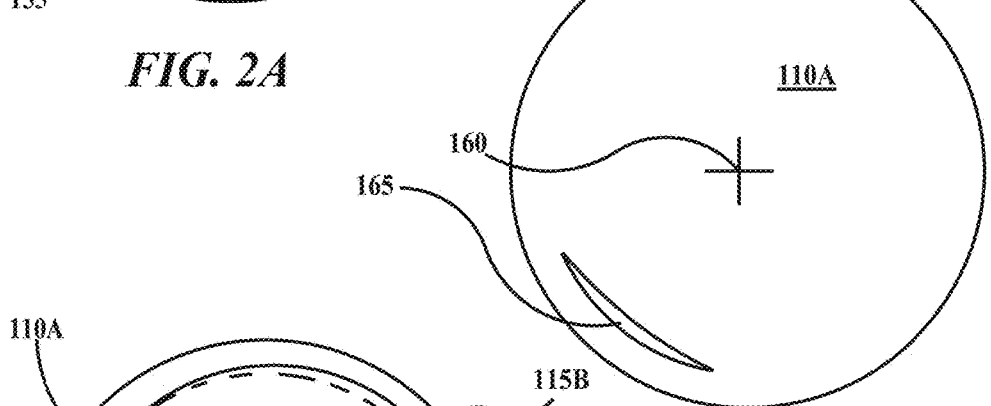
Figure 2C:
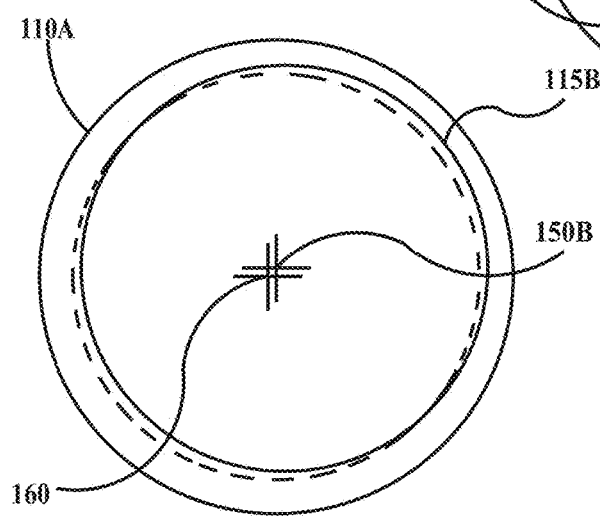

FIGS. 2A, 2B and 2C illustrate a mechanism observed to cause defects on wafers. In FIG. 2A, a wafer 115A having a center 150A was processed through a high density plasma (HDP) oxide apparatus and was observed to have a region 155 where the integrated circuit chips were defective due to metal line voiding. In FIG. 2B, wafer chuck 110A (having a center 160) that was used to process substrate 115A was examined and found to have a region 165 where HDP oxide had been deposited. The shape and location of region 165 corresponded to that of region 155 of substrate 115A. The cause of the problem was determined to be off-center placement of a previous wafer 115B (having a center 150B) on wafer chuck 110A allowing deposition of HDP oxide on the chuck in a position normally protected by the substrates as illustrated in FIG. 2C. The deposited HDP oxide prevented the edge of substrate 115A from contacting the wafer chuck in region 155 thereby preventing full cooling of the substrate in the region and causing metal line voids.

While the observations were made in an HDP deposition apparatus, embodiments of the present invention are applicable to apparatus that perform plasma depositions of other dielectric materials in addition to HDP oxide, examples of which plasma enhanced chemical vapor deposition (PECVD) of silicon nitride, silicon-oxy-nitride and deposition of silicon oxide using tetraethylorthosilicate (TEOS). The invention is also useful in plasma etch and reactive ion etch (RIE) apparatus. Embodiments of the present invention are useful for detecting FM on wafer chucks from other sources as well.

It is a feature of the present invention that no machined or ground locating marks such as notches or flats are required to be formed on the wafer surface or edges, thus the sensors can be placed to detect any edge or surface of the wafer.

Figure 3A:
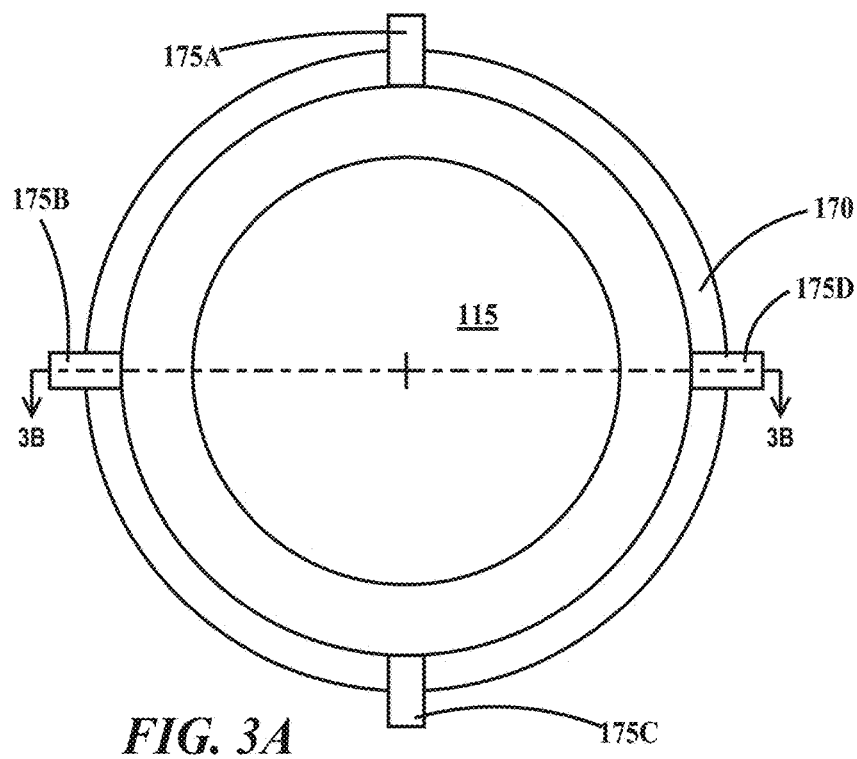
FIG. 3A is a top view.
Figure 3C:
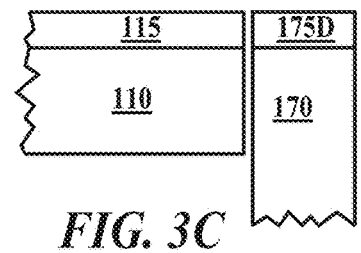
FIG. 3B is a side view and FIG. 3C is a detailed view illustrating an embodiment of the present invention using horizontal sensors.
Figure 3B:
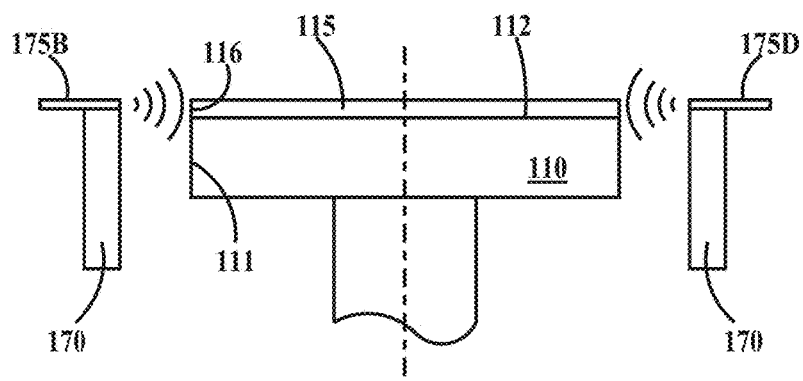

FIG. 3A is a top view, FIG. 3B is a side view and FIG. 3C is a detailed view illustrating an embodiment of the present invention using horizontal sensors. In FIGS. 3A and 3B, wafer 115 is positioned on the top surface 112 of wafer chuck 110 so the edges of wafer 115 and chuck 110 are aligned. In one example, wafer chuck 115 is an electrostatic chuck. No portion of top surface 112 of wafer chuck is exposed. Wafer chuck 110 is surrounded by a circular ring 170. Ring 170 includes ultrasonic sensors 175A, 175B, 175C and 175D. Ultrasonic sensors 175A, 175B, 175C and 175D both emit and detect ultrasonic sound waves. While ring 170 is shown spaced away from chuck 110 for clarity, ring 110 may be sized and positioned to just fit around chuck 110 with minimal clearance (e.g., a tenth of an inch or less) as illustrated in FIG. 3C. In FIG. 3C, the top of ultrasonic sensor 175D is coplanar with the top surface of wafer 115 because it is notched into ring 170. The top surface of ring 170 is coplanar with the top surface of wafer 115 wherever there is no ultrasonic sensor. While ultrasonic sensor 175D is illustrated as directly facing the edge of wafer 115, it may be positioned tilted so that the ultrasonic points upward to the edge wafer 115. In the tilted orientation, if wafer 115 is mispositioned away from ultrasonic sensor 175D, there will be little to no return signal which may be accounted for in calculating return times with a default value. The variation of FIG. 3C may be used in all embodiments of the present invention. Ultrasonic sensors 175A and 175C are positioned opposite each other and ultrasonic sensors 175B and 175D are positioned opposite each other. In FIGS. 3A and 3B, the edge 116 of wafer 115 is aligned to the edge 111 of chuck 110 which is the specified and nominal placement position of wafer 115 on chuck 110. No portion of the top surface of 112 of chuck 110 is exposed when the wafer is placed the specified and nominal placement position. While four ultrasonic sensors are illustrated, a minimum of two ultrasonic sensors placed at 90° relative to the circumference of the wafer may be used with three or more sensors are preferred in this embodiment.

Figure 4A:
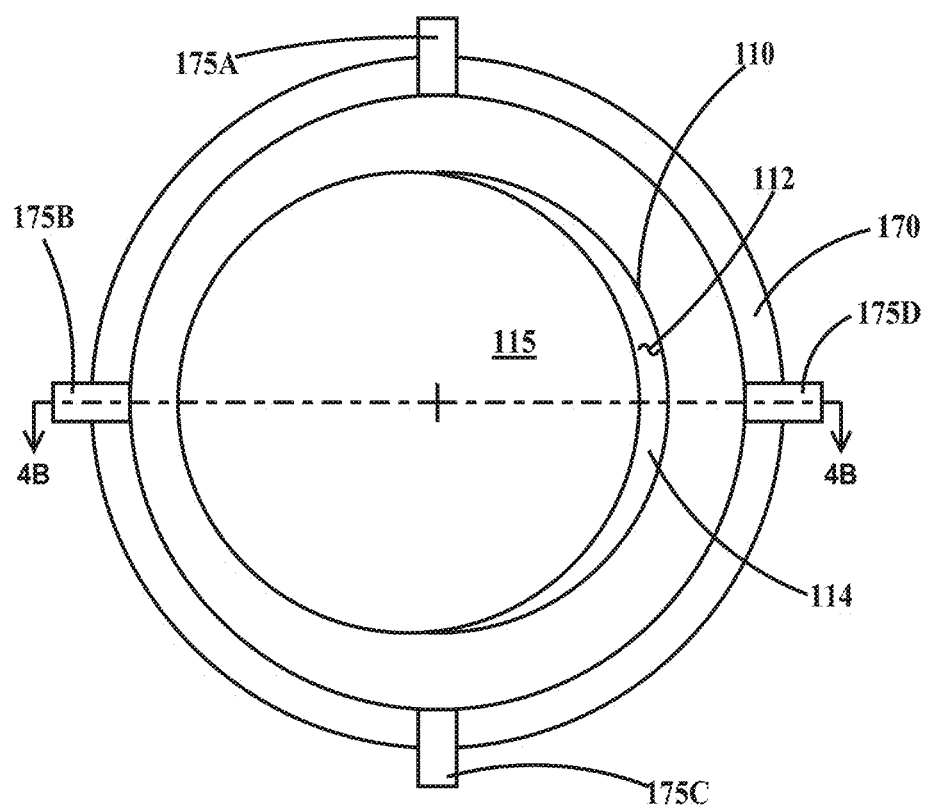
FIG. 4A is a top view and FIG. 4B is a side view illustrating detecting horizontal wafer misplacement according to the embodiment of the present invention of FIGS. 3A and 3B.
Figure 4B:
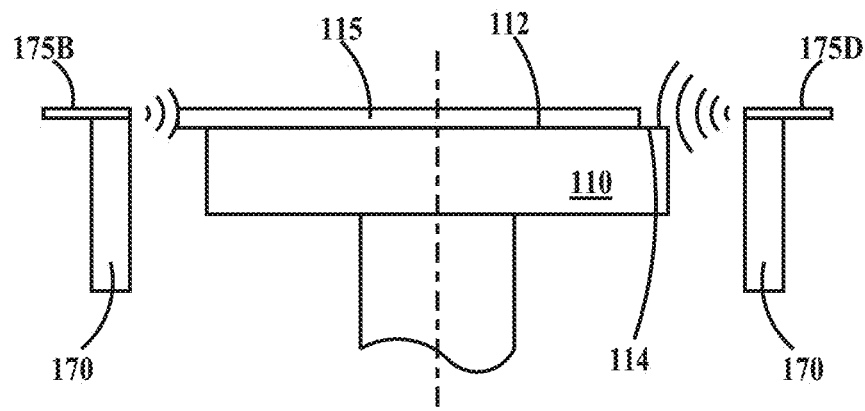

FIG. 4A is a top view and FIG. 4B is a side view illustrating detecting horizontal wafer misplacement according to the embodiment of the present invention of FIGS. 3A and 3B. The horizontal direction is defined as any direction parallel to top surface 112 of wafer chuck 110. The vertical direction is defined as any direction perpendicular to top surface 112 of wafer chuck 110. In FIGS. 4A and 4B, wafer 115 is mispositioned in the horizontal direction because a portion 114 of top surface 112 of wafer chuck 110 is exposed. It will take longer for ultrasonic sound waves to return to ultrasonic sensor 175D then to ultrasonic sensor 175B. However, it is more accurate to compare the measured return time (MRT) to a calibrated return time (CRT) for each ultrasonic sensor as described infra.

Figure 5A:
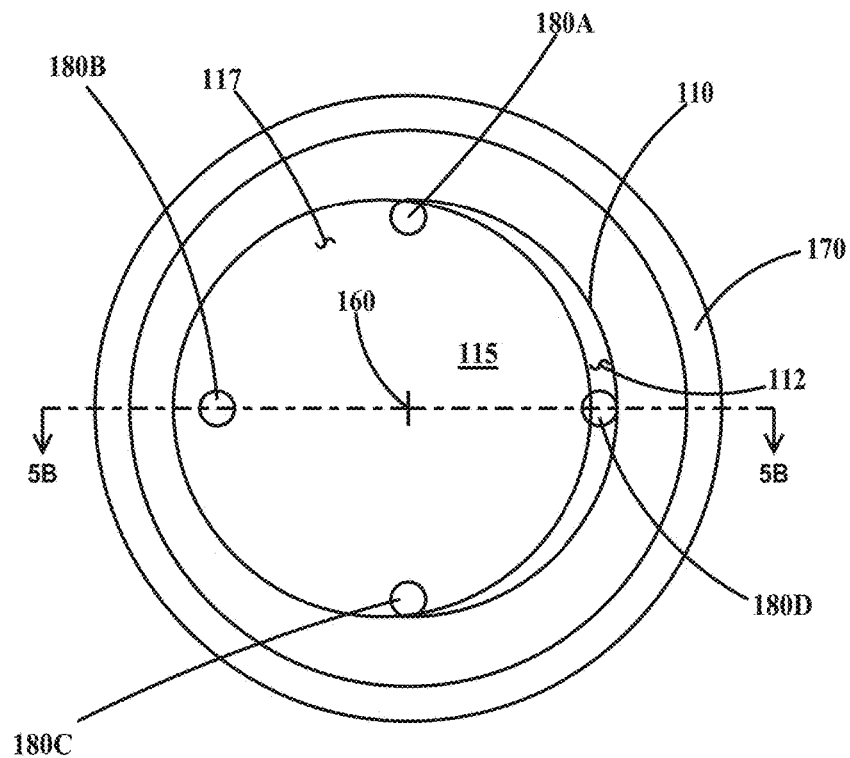
FIG. 5A is a top view and FIG. 5B is a side view illustrating an embodiment of the present invention using vertical sensors.
Figure 5B:
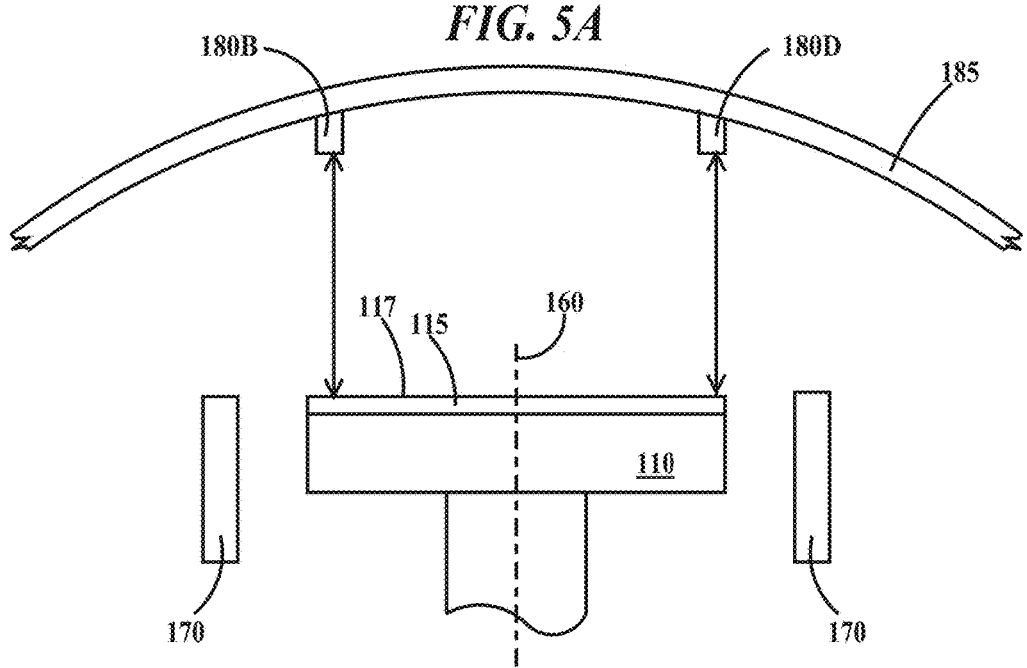

FIG. 5A is a top view and FIG. 5B is a side view illustrating an embodiment of the present invention using vertical sensors. In FIGS. 3A and 3B, wafer 115 is positioned on the top surface 112 of wafer chuck 110 so the edges of wafer 115 and chuck 110 are aligned. No portion of top surface 112 of wafer chuck is exposed. Ultrasonic sensors 180A, 180B, 180C and 180D are positioned above the top surface 117 of wafer 115. By way of example, in FIG. 5B, ultrasonic sensors 180A, 180B, 180C and 180D are positioned proximate to or attached to a dome 185 positioned over wafer chuck 110. Ultrasonic sensors 180A, 180B, 18C and 180D are positioned over the periphery of wafer chuck 110 and are arranged at 900 angles to each other relative to center 160 of wafer chuck 110. Ultrasonic sensors 180A, 180B, 180C and 180D both emit and detect ultrasonic sound waves. While four ultrasonic sensors are illustrated, a minimum of two ultrasonic sensors placed at 900 relative to the circumference of the wafer may be used with three or more sensors are preferred in this embodiment.

Figure 6A:
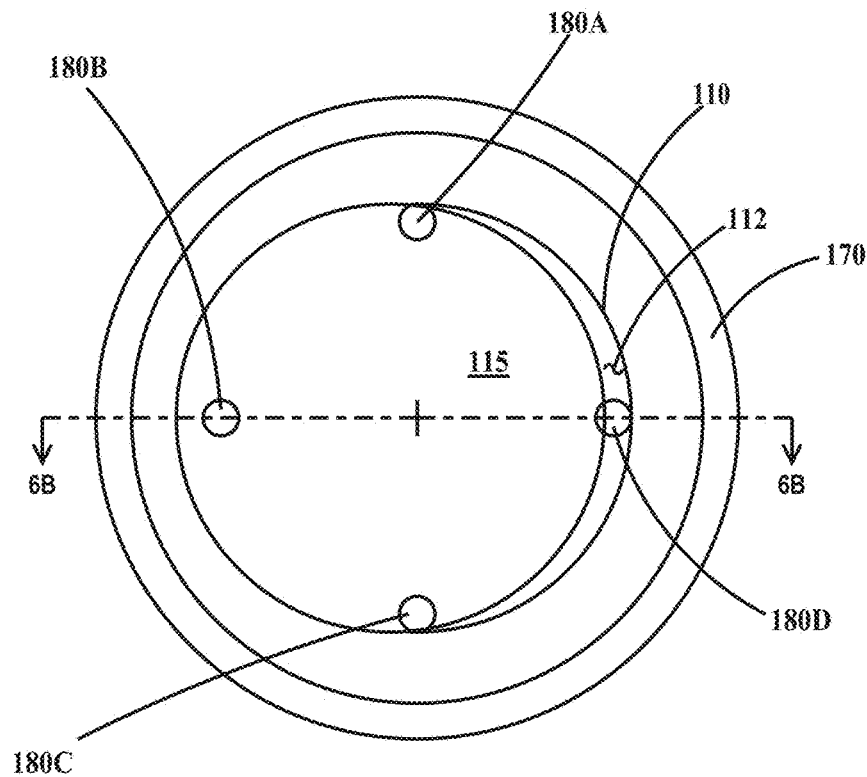
FIG. 6A is a top view and FIG. 6B is a side view illustrating detecting horizontal wafer misplacement according to the embodiment of the present invention of FIGS. 5A and 5B.
Figure 6B:
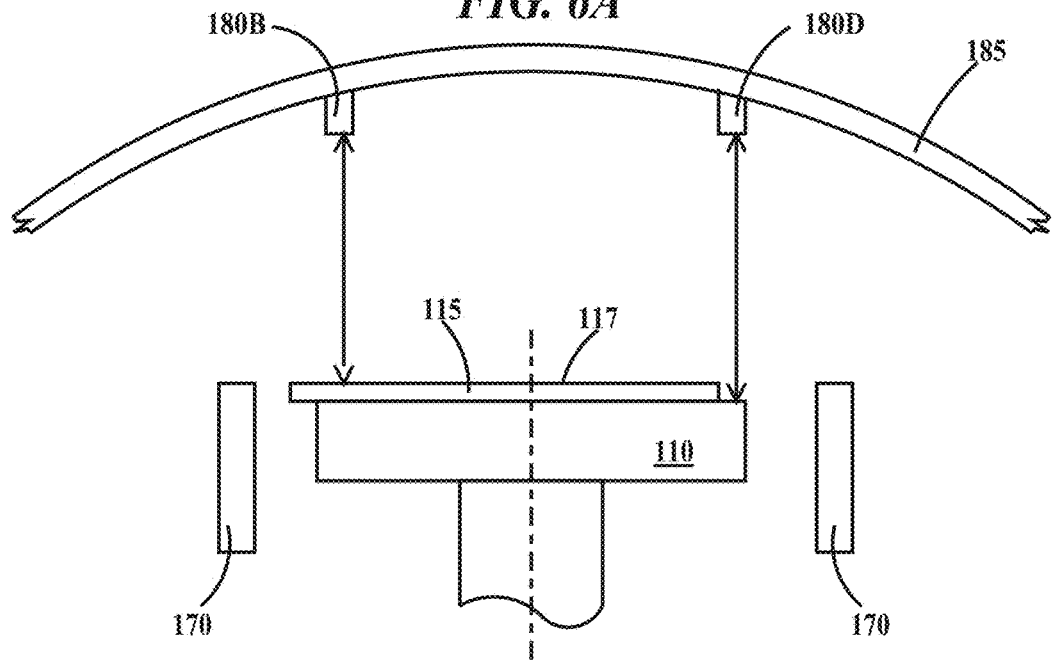

FIG. 6A is a top view and FIG. 6B is a side view illustrating detecting horizontal wafer misplacement according to the embodiment of the present invention of FIGS. 5A and 5B. In FIGS. 6A and 6B, wafer 115 is mispositioned the same as in FIG. 4B. Thus, the return time for ultrasonic sensor 180D in FIG. 6B will be greater when compared to the return time of ultrasonic sensor 180D in FIG. 5B.

Figure 7A:
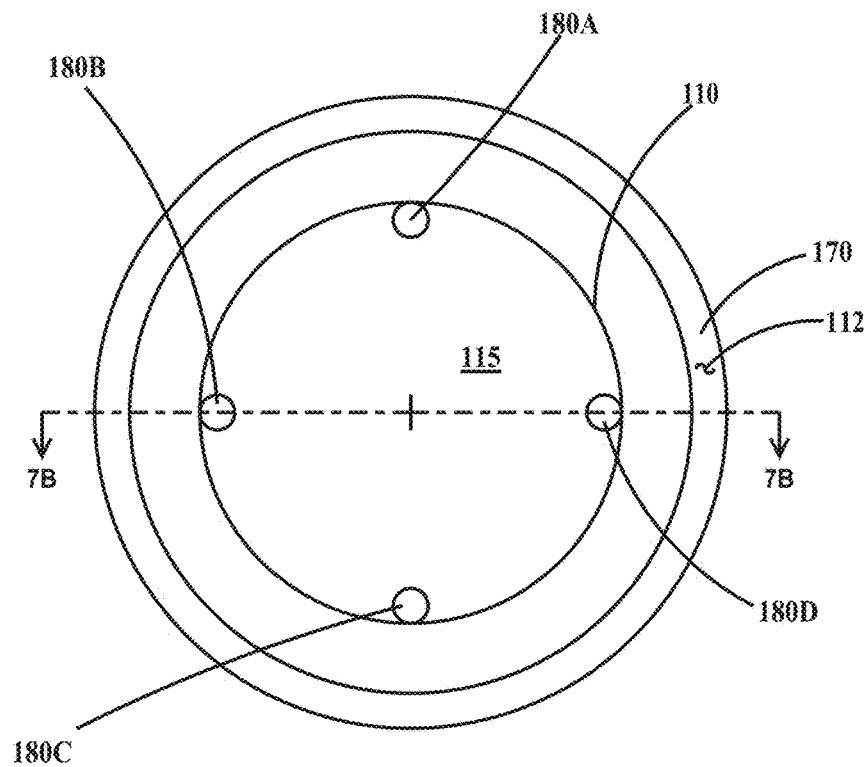
FIG. 7A is a top view and FIG. 7B is a side view illustrating detecting vertical wafer misplacement caused by FM according to the embodiment of the present invention of FIGS. 5A and 5B.
Figure 7B:
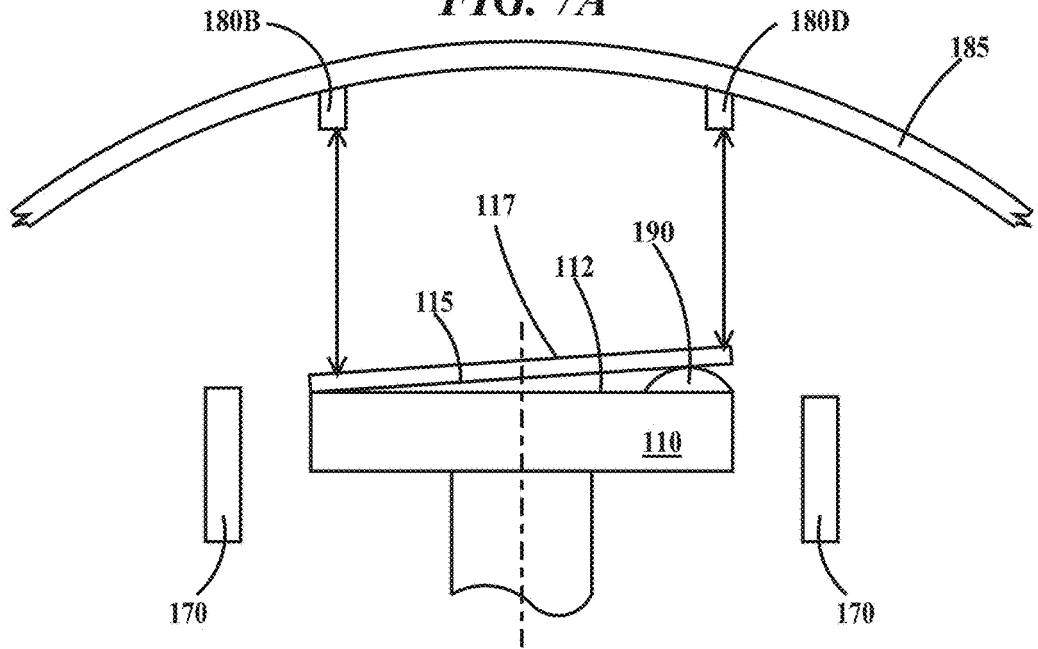

FIG. 7A is a top view and FIG. 7B is a side view illustrating detecting vertical wafer misplacement caused by FM according to the embodiment of the present invention of FIGS. 5A and 5B. In FIGS. 7A and 7B, FM 190 on the top surface of 112 of wafer chuck 110 causes wafer 115 to not fully contact wafer chuck 110. Thus, the return time for ultrasonic sensor 180D in FIG. 7B will be less when compared to the return time for ultrasonic sensor 180D in FIG. 5B.

Figure 8A:
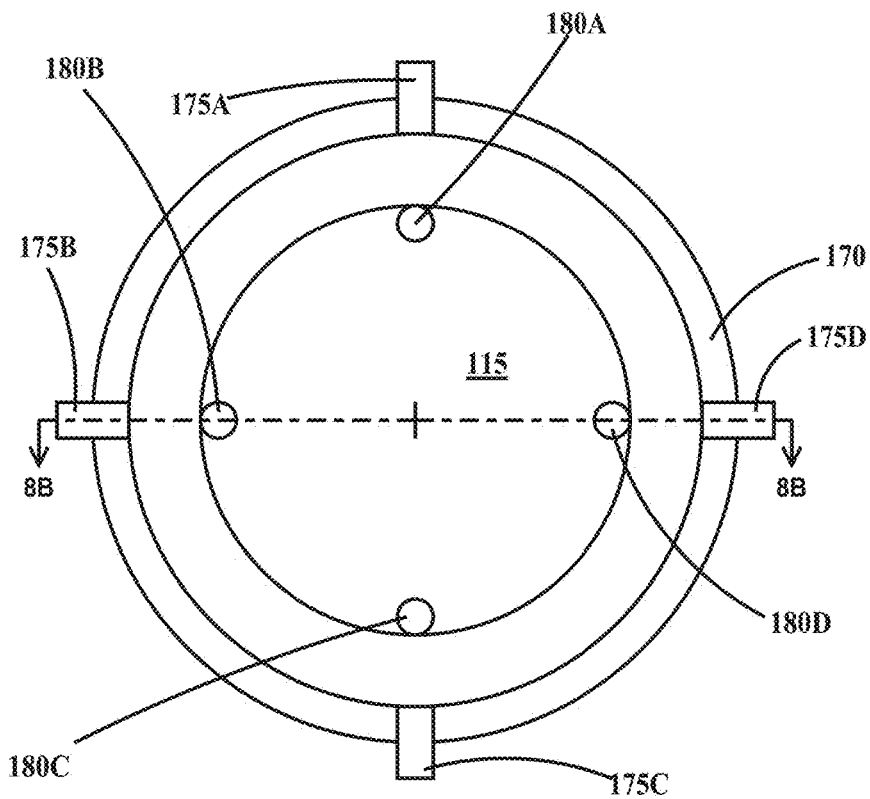
FIG. 8A is a top view and FIG. 8B is a side view illustrating an embodiment of the present invention using both horizontal and vertical sensors.
Figure 8B:
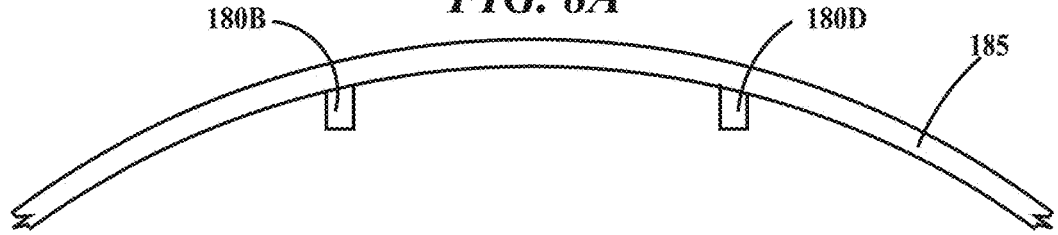
Figure 8B:
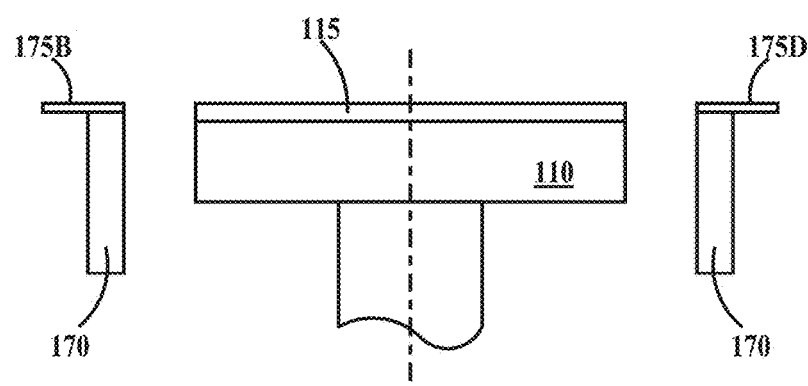

FIG. 8A is a top view and FIG. 8B is a side view illustrating an embodiment of the present invention using both horizontal and vertical sensors. In FIGS. 8A and 8B, ultrasonic sensors 175A, 175B, 175C and 175D of circular ring 170 and ultrasonic sensors 180A, 180B, 180C and 180D positioned proximate to or attached to dome 185 are present.

Figure 9A:
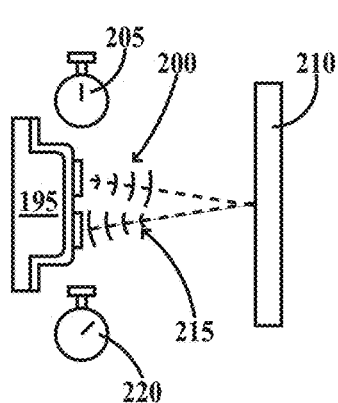
FIGS. 9A through 9E illustrate operation of the ultrasonic sensors according to embodiments of the present invention.
Figure 9B:
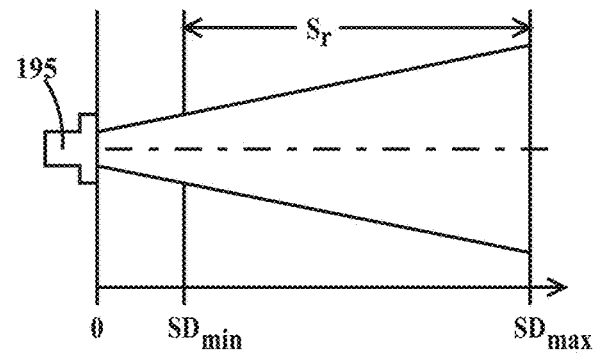
Figure 9C:
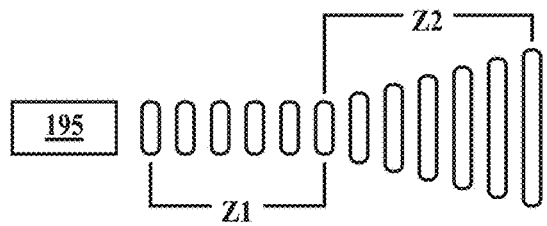
Figure 9D:
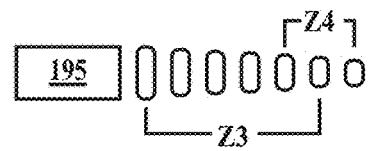
Figure 9E:
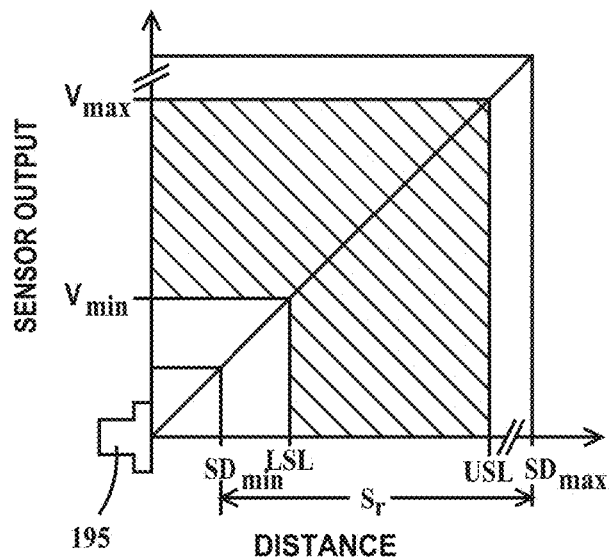

FIGS. 9A through 9E illustrate operation of the ultrasonic sensors according to embodiments of the present invention. In FIG. 9A, an ultrasonic sensor 195 emits a high-frequency sound wave 200 at time 205 which bounces off a target 210 and generates a return signal (again a high-frequency sound wave) 215 that is detected by ultrasonic sensor 195 at time 220. The difference in time 205 and time 220 is the return time. FIG. 9B illustrates that the concept of the usable sensing range of ultrasonic sensor 195. $SD_{min}$ is the minimum distance from ultrasonic sensor 195 that an object can be detected. Inside this distance no usable signal will be generated by the sensor. $SD_{max}$ is maximum distance from ultrasonic sensor 195 that an object can be detected. Past this distance no usable signal will be generated by the sensor. Thus, there is a sensing range SR that an object must be in for its distance from the sensor to be measured. Ultrasonic sensors can be operated in two modes, unfocused and focused. FIG. 9C illustrates the unfocused mode of ultrasonic sensor 195 in which there is a Fresnel zone Z1 and a Fraunhofer zone Z2. FIG. 9D illustrates the focused mode of ultrasonic sensor 195 in which there is a focal depth Z3 and a focal zone Z4. It is preferred that the ultrasonic sensors of embodiments of the present invention be run in focused mode. FIG. 9E plots sensor output vs. distance. SR is obtained from the data sheet of the ultrasonic sensor. Lower set limit (LSL) and upper set limit (USL) are the detection distances set by the user via DIP switches or software commands to the sensor. The output of the sensor emits and detects thus falls between a minimum value $V_{min}$ and a maximum value $V_{max}$ that corresponds to the LSL and USL. The output may be milliamps, volts, digital output or sensor cycles. The cross-hatched area defines the parametric limits of the system.

FIG. 10 is a side view of an exemplary wafer position calibration fixture. In FIG. 10, wafer 115 is aligned to the edges of chuck 110 using a cylindrical guide ring 225 positioned between ring 170 and wafer chuck 110. This is the position which every wafer processed through the tool is supposed to be placed by the wafer handling system. This sets the distances between the ultrasonic sensors (not shown) and the edge of wafer 115. Other calibrations fixtures may be used.

FIG. 11 is a schematic diagram of the tool controller link to the ultrasonic sensors of embodiments of the present invention. In FIG. 11 an array 230 of ultrasonic sensors are connected to a tool controller 240. Tool controller controls both the operation of the ultrasonic sensors and of the loading and unload and processing of the wafers. Tool controller 240 includes a microprocessor 245, a memory 250, an input device 255 (which may conation such devices as a keyboard, a mouse, switches, buttons, etc), and a display unit 260. Microprocessor 245 sends control signals (which include on/off signals and may include software instructions to program the ultrasonic sensors) to the ultrasonic sensors of array 230. Microprocessor 245 also calculates return times from the ultrasonic sensors of array 230 and then stores the return times in memory unit 250.

FIG. 12A is a flow diagram of a method of calibrating the apparatus of embodiments of the present invention. In step 265, a guide ring is placed around the wafer chuck. In step 270, a wafer is placed inside the guide ring on the chuck. In step 275, the guide ring is removed, leaving the wafer in place. In step 280, the ultrasonic sensors are activated and the sensor return times are measured. In step 285, the sensor return times are recorded as calibration return times (CRTs). There is a CRT for each sensor. The wafer is then removed from the chuck in step 290.

Figure 12B:
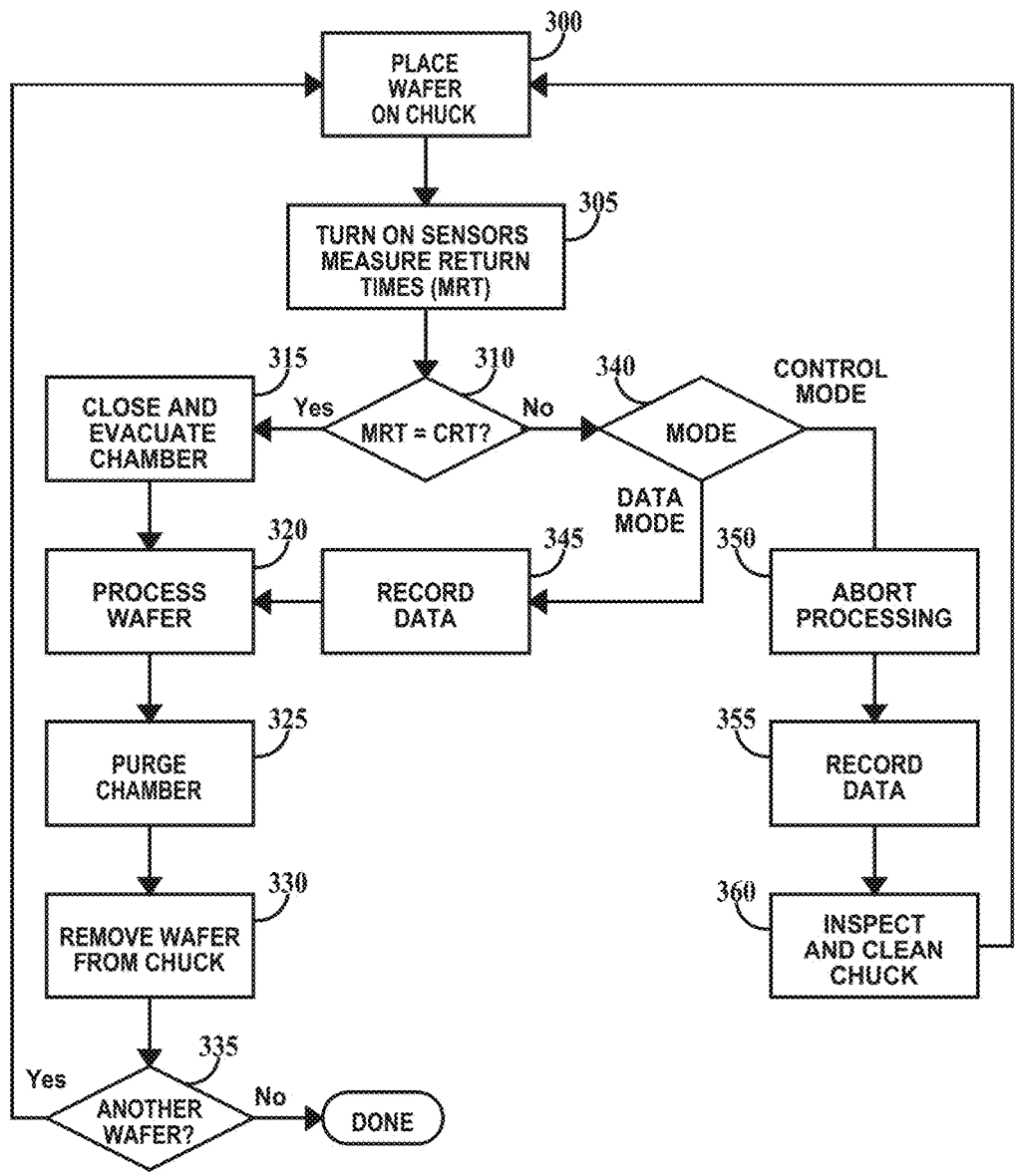
FIG. 12B is a flowchart illustrating a method of using the apparatus of embodiments of the present invention.

FIG. 12B is a flowchart illustrating a method of using the apparatus of embodiments of the present invention. Prior to this operation, the ultrasonic sensors will have been calibrated as described supra. In step 300, a wafer is placed on the chuck by the handling system. The tool is at room pressure. In step 305, the ultrasonic sensors are turned on and the response time (MRT) of each of the ultrasonic sensors is measured. The ultrasonic sensors are then turned off. In step 310, the MRTs are compared to the CRTs of the respective ultrasonic sensors. If all the MRTs match the CRTs (within pre-defined limits) then the method proceeds to step 315. In step 315, the process chamber is closed and evacuated. In step 320, the wafers are processed. Exemplary processes include, but are not limited to depositions of dielectric materials, deposition of HDP oxide, PECVD silicon nitride, PECVD silicon-oxy-nitride deposition of TEOS, plasma etch and RIE. In step 325, the process chamber is purged and in step 330 the wafer is removed from the chuck. In step 335, if there is another wafer to be processed, the method loops back to step 300, otherwise the method terminates.

Returning to step 310. If, in step 310, for at least one ultrasonic sensor its MRT does not match the CRT then the method proceeds to step 340. In step 340, it is determined whether the tool is being operated in control mode or data mode. If the tool is being operated in data mode, logistical data as to date/time, wafer ID and which ultrasonic sensor had the MRT to CRT mismatch is recorded in step 345 and the method proceeds to step 320. This data can then be correlated with post processing inspection/test data for this wafer and subsequently processed wafers to determine if there is a correlation between the MRT to CRT mismatch and the inspection/test data. The chuck can also be inspected after processing of subsequent wafer processing is complete. It should be noted that the MRT and the CRT can be converted to distance using the formula Distance to object=½(speed of sound)×the MRT or CRT. Thus measuring return time also measures distance. Since the sensor positions are known, the exact region of the wafer chuck can be identified for inspection.

Returning to step 340, if the tool is being operated in control mode then the method proceeds to step 350. In step 350, processing is aborted and the wafer removed from the chuck. Next the method proceeds to step 355. Step 355 is similar to step 345. Next the method proceeds to step 360 where the chuck is inspected and cleaned if necessary. The method may then start over at step 300.

Thus, embodiments of the present invention provide an apparatus and method for determining the location of wafer on wafer chucks used in semiconductor processing and for detecting miss-positioning thereof and are applicable to non-semiconductor substrates or semiconductor substrates that have a shape different from a semiconductor wafer.

The descriptions of the various embodiments of the present invention have been presented for purposes of illustration, but are not intended to be exhaustive or limited to embodiments disclosed. Many modifications and variations will be apparent to those of ordinary skill in the art without departing from the scope and spirit of the described embodiments. The terminology used herein was chosen to best explain the principles of embodiments, the practical application or technical improvement over technologies found in the marketplace, or to enable others of ordinary skill in the art to understand embodiments disclosed herein.

What is claimed is:

1. An apparatus, comprising:
   a chuck configured to removeably hold a substrate for processing;
   an array of three or more ultrasonic sensors, each ultrasonic sensor of the three or more ultrasonic sensors configured to emit and detect ultrasonic sound waves, each ultrasonic sensor of the three or more ultrasonic sensors positioned relative to the chuck so as to send a respective ultrasonic sound wave to a respective preselected peripheral region of the substrate and receive a respective return ultrasonic sound wave from the preselected peripheral region of the substrate;
   a ceramic ring surrounding the chuck, wherein each ultrasonic sensor of the three or more ultrasonic sensors is notched into the ceramic ring, wherein a top surface of the ceramic ring is coplanar with a top surface of the chuck wherever on the ceramic ring there is a respective ultrasonic sensor of the three or more ultrasonic sensors, and wherein the top surface of the ceramic ring is coplanar with the top surface of the substrate wherever on the ceramic ring there is no ultrasonic sensor of the three or more ultrasonic sensors; and
   a controller connected to the array of three or more ultrasonic sensors and configured to compare a measured position of the substrate on the chuck to a specified placement of the substrate on the chuck.

2. The apparatus of claim 1, wherein the three or more ultrasonic sensors are equally spaced from one another.

3. The apparatus of claim 1, wherein the measured position of the substrate on the chuck is compared to the specified placement of the substrate on the chuck based on a measured elapsed time between sending the ultrasonic sound wave and receiving the return ultrasonic sound wave for each ultrasonic sensor of the array of three or more ultrasonic sensors.

4. The apparatus of claim 3, wherein the controller includes a micro-processor and a memory unit, said controller configured to compare the measured elapsed time between sending the ultrasonic sound wave and receiving the return ultrasonic sound wave for each ultrasonic sensor of the array of three or more ultrasonic sensors to a calibration time for the ultrasonic sensor.

5. The apparatus of claim 4, wherein processing of substrates is aborted if the measured elapsed time is different from the calibrated time by a specified amount of time for any ultrasonic sensor of the array of three or more ultrasonic sensors.

6. The apparatus of claim 4, wherein the measured elapsed time is recorded in the memory unit for each substrate processed.

7. The apparatus of claim 1, wherein the measured elapsed time between sending the ultrasonic sound wave and receiving the return ultrasonic sound wave for each ultrasonic sensor of the array of three or more ultrasonic sensors.

8. The apparatus of claim 1, wherein a top surface of each ultrasonic sensor of the three or more ultrasonic sensors is coplanar with a top surface of the substrate.

9. The apparatus of claim 1, wherein a bottom surface of each ultrasonic sensor of the three or more ultrasonic sensors is coplanar with a bottom surface of the substrate.

10. The apparatus of claim 1, wherein the bottom surface of the substrate is in direct physical contact with the top surface of the chuck.

11. The apparatus of claim 1, wherein the substrate has a peripheral edge, and wherein each ultrasonic sensor of the three or more ultrasonic sensors is configured to detect a respective distance of the peripheral edge of the substrate from the ultrasonic sensor.

12. The apparatus of claim 1, wherein each ultrasonic sensor of the three or more ultrasonic sensors is positioned to detect a respective distance of a peripheral region of the top surface of the substrate from the ultrasonic sensor.

13. The apparatus of claim 1, wherein each ultrasonic sensor of the array of three or more ultrasonic sensors is attached to the ceramic ring and positioned to detect a respective distance of a peripheral edge of the substrate from the ultrasonic sensor.

14. The apparatus of claim 1, wherein each ultrasonic sensor of the three or more ultrasonic sensors is configured to operate in focused mode having a focal depth and a focal zone.

15. The apparatus of claim 1, wherein the controller includes a micro-processor and a memory unit.

16. The apparatus of claim 1, wherein the chuck is an electrostatic chuck and the chuck is configured to hold a semiconductor wafer having no machined or ground flats or notches formed on the edge of the semiconductor wafer.

17. The apparatus of claim 1, wherein the chuck and the three or more ultrasonic sensors are in a process chamber.

18. The apparatus of claim 17, wherein the process chamber is a vacuum chamber and the apparatus is a plasma deposition or reactive ion etch apparatus.

19. A method, comprising:
    providing an apparatus comprising:
       a chuck configured to removeably hold a substrate for processing;
       an array of three or more ultrasonic sensors, each ultrasonic sensor of the three or more ultrasonic sensors configured to emit and detect ultrasonic sound waves, each ultrasonic sensor of the three or more ultrasonic sensors equally spaced from each other and arranged about a center of the chuck and positioned relative to the chuck so as to send a respective ultrasonic sound wave to a respective preselected peripheral region of the substrate and receive a respective return ultrasonic sound wave from the preselected peripheral region of the substrate;
       a ceramic ring surrounding the chuck, wherein each ultrasonic sensor of the three or more ultrasonic sensors is notched into the ceramic ring, wherein a top surface of the ceramic ring is coplanar with a top surface of the chuck wherever on the ceramic ring there is a respective ultrasonic sensor of the three or more ultrasonic sensors, and wherein the top surface of the ceramic ring is coplanar with the top surface of the substrate wherever on the ceramic ring there is no ultrasonic sensor of the three or more ultrasonic sensors; and
       a controller; and
    placing the substrate on the chuck; and
    measuring a position of the substrate on the chuck using the array of three or more ultrasonic sensors and comparing, by the controller, the measured position to a specified position on the chuck.

20. The method of claim 19, wherein said comparing the measured position to the specified position on the chuck is based on a measured elapsed time between sending the ultrasonic sound wave and receiving the return ultrasonic sound wave for each ultrasonic sensor of the array of three or more ultrasonic sensors.

* * * * *